United States Patent
Vodakov et al.

(10) Patent No.: US 6,547,877 B2
(45) Date of Patent: *Apr. 15, 2003

(54) TANTALUM CRUCIBLE FABRICATION AND TREATMENT

(75) Inventors: Yury Alexandrovich Vodakov, St. Petersburg (RU); Evgeny Nikolaevich Mokhov, St Petersburg (RU); Mark Grigorievich Ramm, Rego Park, NY (US); Alexandr Dmitrievich Roenkov, St. Petersburg (RU); Yury Nikolaevich Makarov, Richmond, VA (US); Sergei Yurievich Karpov, St. Petersburg (RU); Mark Spiridonovich Ramm, St Petersburg (RU); Leonid Iosifovich Temkin, St. Petersburg (RU)

(73) Assignee: The Fox Group, Inc., Livermore, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 09/849,767

(22) Filed: May 4, 2001

(65) Prior Publication Data

US 2002/0083890 A1 Jul. 4, 2002

Related U.S. Application Data

(63) Continuation-in-part of application No. 09/355,561, filed as application No. PCT/RU97/00005 on Jan. 22, 1997, now Pat. No. 6,261,363.

(30) Foreign Application Priority Data

Jan. 22, 1997 (WO) .............................. PCT/RU97/00005

(51) Int. Cl.$^7$ ........................... C30B 25/12; C30B 29/34
(52) U.S. Cl. .................. 117/105; 117/107; 117/109; 117/200; 117/201; 117/900; 117/952
(58) Field of Search .................. 117/900, 105, 117/107, 109, 200, 201, 952

(56) References Cited

U.S. PATENT DOCUMENTS 2,854,364 A  9/1958 Lely (List continued on next page.)

FOREIGN PATENT DOCUMENTS

DE  3230727  2/1984

(List continued on next page.)

OTHER PUBLICATIONS

Hofmann et al.,"Use of Ta container material for quality improvement of SiC", Institute of Physics Confernece Series vol 142, pp 29–32 1996 abstract only.*

(List continued on next page.)

*Primary Examiner*—Robert Kunemund
(74) *Attorney, Agent, or Firm*—Bingham McCutchen, LLP; David G. Beck

(57) ABSTRACT

A method and apparatus for axially growing single crystal silicon carbide is provided. Utilizing the system, silicon carbide can be grown with a dislocation density of less than $10^4$ per square centimeter, a micropipe density of less than 10 per square centimeter, and a secondary phase inclusion density of less than 10 per cubic centimeter. As disclosed, a SiC source and a SiC seed crystal of the desired polytype are co-located within a crucible, the growth zone being defined by the substantially parallel surfaces of the source and the seed in combination with the sidewalls of the crucible. Prior to reaching the growth temperature, the crucible is evacuated and sealed, either directly or through the use of a secondary container housing the crucible. The crucible is comprised of tantalum or niobium that has been specially treated. As a result of the treatment, the inner surfaces of the crucible exhibit a depth variable composition of Ta—Si—C or Nb—Si—C that is no longer capable of absorbing SiC vapors, thus allowing the vapor-phase composition within the crucible to be close to the SiC—Si system with the partial pressure of Si-vapor slightly higher than that in the SiC—Si system.

34 Claims, 1 Drawing Sheet

U.S. PATENT DOCUMENTS

| | | | |
|---|---|---|---|
| 4,125,756 A | 11/1978 | Hierholzer, Jr., et al. | ... 219/121 |
| 4,147,572 A | 4/1979 | Vodakov et al. | ............ 148/175 |
| 4,302,508 A | 11/1981 | Hierholzer, Jr. et al. | .... 428/367 |
| 4,556,436 A | 12/1985 | Addamiano | ................ 148/175 |
| 4,866,005 A | 9/1989 | Davis et al. | ................ 437/100 |
| 5,433,167 A | 7/1995 | Furukawa et al. | ............ 117/84 |
| 5,964,944 A * | 10/1999 | Sugiyama et al. | .......... 117/102 |
| 6,261,363 B1 * | 7/2001 | Vodakov et al. | ............ 117/104 |

FOREIGN PATENT DOCUMENTS

| | | | |
|---|---|---|---|
| JP | 59-35099 | | 2/1984 |
| JP | 11-116398 | * | 4/1999 |
| JP | 11-116399 | * | 4/1999 |
| RU | 403275 | | 7/1973 |
| RU | 882247 | | 7/1980 |
| WO | 2001-004389 | * | 10/2001 |

OTHER PUBLICATIONS

Hoffmann, et al., "Use of Ta Container Material for Quality Improvement of SiC Crystals Grown by Sublimation Technique", Int'l Conf. on Silicon Carbide and Related Materials (1995) pp. 1–4.

E.N. Mokhov, et al., "Crowing of Epitaxial Layers of Silicon Carbide", Vysokochistie veshchesta, No. 3, 1992, pp. 98–105.

S. Yu, et al., "Excess Phase Formation During Sublimation Growth of Silicon Carbide", Int.'l Conf. on Silicon Carbide and Related Materials (1995), pp. 1–4.

Yu V. Koritsky, et al., "Electrochemical Materials Manual", (1988), p. 449.

E.N. Mokhov, et al."Growth of Silicon Carbide Bulk Crystals By the Sublimation Sandwich Method", Materials Science and Engineering B46 (Jun. 4, 1997), pp. 317–323.

E.N. Mokhov, et al., "SiC Growth in Tantalum Containers by Sublimation Sandwich Method", Journal of Crystal Growth, 181 (Apr., 1997) pp. 254–258.

S. Yu Karpov, et al., "Analysis of Sublimation Growth of Bulk SiC Crystals in Tantalum Container", Journal of Crystal Growth, 211 (2000) pp. 347–351.

* cited by examiner

TANTALUM CRUCIBLE FABRICATION AND TREATMENT

CROSS-REFERENCES TO RELATED APPLICATIONS

This application is a continuation-in-part of U.S. patent application Ser. No. 09/355,561, filed Jul. 20, 1999, which claims priority from PCT Application Serial No. PCT/RU97/00005, filed Jan. 22, 1997.

FIELD OF THE INVENTION

The present invention relates generally to the generation of monocrystalline materials and, more particularly, to a method and apparatus for growing monocrystalline silicon carbide.

BACKGROUND OF THE INVENTION

Silicon carbide (SiC) is wide-band-gap semiconductor material that has a number of characteristics that make it an ideal candidate for a variety of semiconductor applications including, but not limited to, light sources, power diodes, field-effect transistors, and photodiodes. The ability to realize the benefits offered by SiC is largely controlled by the purity of the material as well as its structural characteristics.

The methods most commonly used in producing SiC single crystals are sublimation techniques based on the Lely method, this method utilizing vapor-phase crystallization of evaporated solid silicon carbide. (See, for example, U.S. Pat. Nos. 2,854,364 and 4,866,005). As shown by Karpov et al. in an article entitled *Excess Phase Formation During Sublimation Growth of Silicon Carbide,* 6th Int. Conf. on Silicon Carbide, Kyoto, Japan, 74–75 (September 1995), in order to achieve SiC monocrystalline growth from vapor without forming secondary-phase inclusions, the external silicon (Si) flux on the growing surface must exceed the carbon (C) flux. The ability to achieve the desired excess silicon flux depends on the temperature of the growing surface and, in the case of sublimation techniques, the composition of the vapor adjacent to the growth surface.

As silicon molecules have the maximum concentration in the gaseous phase, any drift of the substance from the growth zone will result in the vapor phase within the growth zone being depleted of silicon and enriched with carbon. Excessive carbon in the growth zone leads to source graphitization, crystal quality degradation, and eventually the discontinuation of the growth process. On the other hand, excessive silicon in the growth zone may result both in the formation of defects on the growing surface of the SiC crystal, primarily due to the precipitation of excess silicon drops, and in the generation of polytypes differing from the seed polytype. Accordingly, it has been established that the best characteristics for the as-grown SiC single crystal are achieved when the vapor composition in the growth zone is shifted the towards the vapor phase corresponding to the SiC—Si system.

U.S. Pat. No. 2,854,364 discloses locating SiC powder with a mass of more than three times the mass of the single crystal to be grown in the growth zone in order to maintain a relatively constant vapor phase composition, the powder serving as a source of silicon carbide vapors. As disclosed, the drift of SiC vapors into the space outside the growth zone is balanced by the generation of SiC vapors from the SiC powder. The duration of the stable growth process is limited by the quantity of SiC powder located in the growth zone. Once the source of SiC vapors becomes depleted, the vapor composition shifts to the non-advantageous SiC—C system.

In U.S. Pat. No. 4,866,005 a technique is disclosed that continuously feeds small portions of SiC powder into a temperature zone of the growth chamber. Although this technique does allow a SiC—Si system to be maintained indefinitely, it is an inefficient process due to the SiC material consumed in addition to the SiC source as well as the growth zone geometry. As disclosed, the evaporating surface of the SiC vapor source is approximately 10 centimeters from the growing surface of the seed crystal, a distance that far exceeds the Si, $Si_2C$, $SiC_2$ molecular track length at the working pressure in the growth zone.

U.S. Pat. No. 4,147,572 discloses a growth technique in which the evaporating surface of the SiC source and the growth surface of the SiC seed crystal are arranged in parallel at a distance that is less than 20 percent of the maximum linear dimension of the source. The single crystals are grown in a graphite crucible in an inert gas atmosphere at temperatures of 1600 to 2000° C. with an axial thermal gradient of 5 to 200° C. per centimeter. This technique is limited to relatively small crystals, typically less than 1 millimeter thick, due to a sharp drop in the growth rate as the crystallization time increases. The change in growth rate is due to the silicon at the edge of the growth zone being volatilized, thereby causing excessive carbon to be released from the evaporating surface of the SiC source and the growing surface of the grown crystal. Single crystals obtained by this technique show defects such as secondary-phase inclusions (predominantly, graphite), micropipes with a density of more than 100 per square centimeter, and dislocations of at least $10^4$ per square centimeter. These crystals also have relatively high concentrations of residual impurities such as boron, oxygen, etc.

In an article by D. Hofmann et al. entitled *The Use of Tantalum Container Material for Quality Improvement of SiC Crystals Grown by the Sublimation Technique,* 6th Int. Conf. on Silicon Carbide, Kyoto, Japan, 15 (September 1995), it was shown that the inclusion of tantalum (Ta) during the sublimation growth of monocrystalline SiC resulted in the vapor medium produced in the growth zone being close to the SiC—Si system. The favorable aspects were found to occur both in an inert gas atmosphere and in vacuum. Unfortunately it was also found that during the early stages of growth, secondary-phase inclusions of tantalum or its compounds were formed. An increased concentration of dissolved tantalum in the monocrystalline SiC was also noted. Lastly, due to the carbon enrichment of the vapor phase that results from silicon drifting outside of the growth zone, carbon dust was embedded into the growing crystal, further reducing the quality of the growing crystal while simultaneously decreasing the transferal efficiency of source material to the growing crystal.

Another problem associated with the use of a Ta container as disclosed in the previously cited article arises during the initial stage of the growth process when the silicon vapors formed by the evaporating SiC source interact with the material of the tantalum container. As a result of this interaction, a low-melting-point tantalum silicon alloy is formed which can lead to the destruction of the container at the normal growth temperature.

In known sublimation techniques for growing SiC single crystals, the vapor source may be either a pre-synthesized SiC powder of the specified dispersity or a polycrystalline or monocrystalline SiC wafer produced, for example, by the Lely method. Although the use of SiC powder is more economical than the use of wafers, providing a continuous supply of powder into the growth zone, as required to grow large single crystals, is quite complicated. Additionally, SiC powder often includes impurities such as graphite or other dust that are transported to the growth surface along with the SiC molecules. These impurities lead to a high density of micropipes and dislocations in the growing crystal, thus substantially impacting the crystal quality.

Accordingly, what is needed in the art is a method and system that allows high quality SiC single crystals to be grown. The present invention provides such a method and system.

SUMMARY OF THE INVENTION

The present invention provides a method and apparatus for growing low dislocation density single crystal silicon carbide. Utilizing the system of the invention, silicon carbide can be grown with a dislocation density of less than $10^4$ per square centimeter, preferably less than $10^3$ per square centimeter, and more preferably less than $10^2$ per square centimeter. The density of micropipes in the as-grown material is less than 10 per square centimeter. The density of secondary phase inclusions is less than 10 per cubic centimeter and preferably less than 1 per cubic centimeter. Depending upon the construction of the crucible, the concentration of tantalum or niobium impurities is less than $10^{17}$ per cubic centimeter.

In accordance with the invention, a SiC source and a SiC seed crystal of the desired polytype are co-located within a crucible with the distance separating the source evaporating surface from the growing surface being comparable to the track length of a SiC molecule. The growth zone is defined by the substantially parallel surfaces of the source and the seed in combination with the sidewalls of the crucible. Prior to reaching the growth temperature, the crucible is evacuated and sealed, either directly or through the use of a secondary container housing the crucible.

In further accordance with the invention, the crucible is comprised of tantalum or niobium that has been specially treated. As a result of the treatment, the inner surfaces of the crucible exhibit a depth variable composition of Ta—Si—C or Nb—Si—C that is no longer capable of absorbing SiC vapors as the monocrystalline silicon carbide is grown. Accordingly, during crystal growth the vapor-phase composition within the crucible is close to the SiC—Si system with the partial pressure of Si-vapor slightly higher than that in the SiC—Si system. Additionally, the resultant Ta—Si—C or Nb—Si—C material is refractory, thus allowing it to withstand the operating temperatures required to grow the silicon carbide.

The crucible is initially fabricated from tantalum or niobium that is preferably at least 99.9 percent pure. Once the crucible is shaped, it undergoes a series of processing steps to clean the surfaces and remove surface contaminants. A thin, near-surface layer of Ta—C or Nb—C is then formed and annealed, resulting in a surface that will not interact with carbon particles. Lastly the crucible is annealed in silicon containing vapor that is diluted by an inert gas, preferably argon, resulting in the formation of a depth variable composition of Ta—Si—C or Nb—Si—C on the crucible surfaces.

A further understanding of the nature and advantages of the present invention may be realized by reference to the remaining portions of the specification and the drawings.

DESCRIPTION OF THE SPECIFIC EMBODIMENTS

Growth Process

Figure 1:
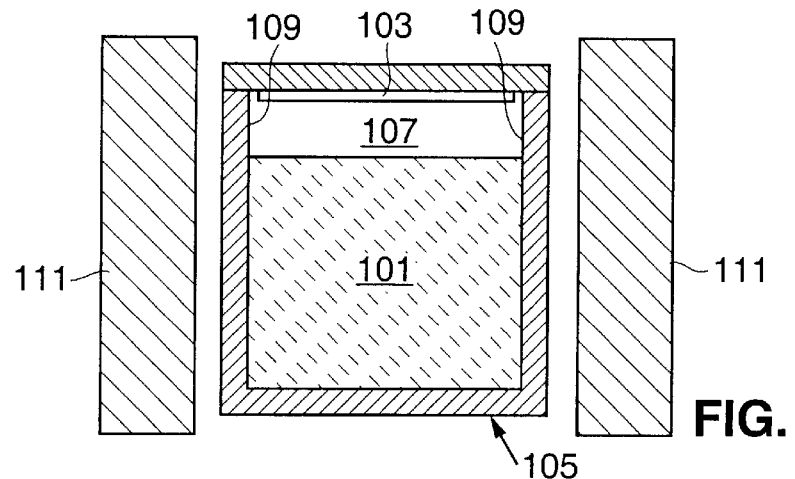
FIG. 1 is a cross-sectional view of a crucible according to the invention.
Figure 2:
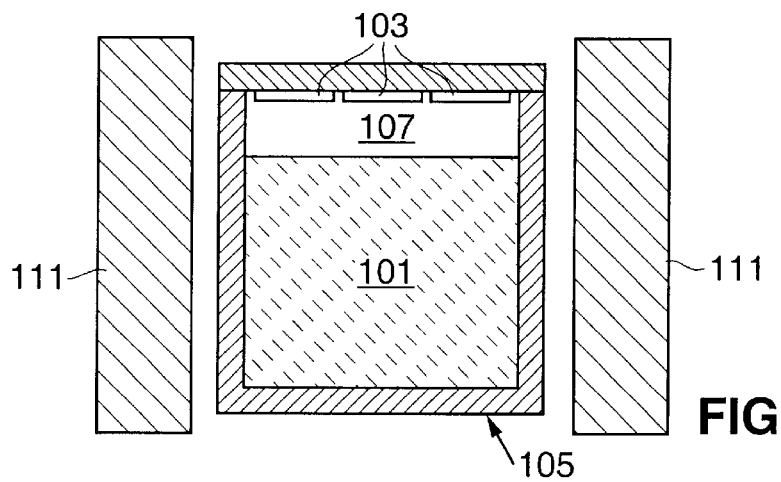
FIG. 2 is a cross-sectional view of a crucible similar to that shown in FIG. 1 with multiple silicon carbide seeds contained therein.

According to the invention and as illustrated in FIG. 1, a silicon carbide (SiC) source 101 and a SiC seed crystal 103 of the desired polytype (e.g., 4H, 6H, 3C, etc.) are co-located within a crucible 105. An axial growth zone 107 is defined by the substantially parallel surfaces of source 101 and seed 103 in combination with sidewalls 109 of crucible 105. If multiple seed crystals 103 are used as illustrated in FIG. 2, their growth surfaces are located within the same plane and parallel to the evaporating surface of source 101.

The distance between the evaporating surface of source 101 and the growing surface of seed crystal 103 is preferably not much in excess of the track length of a SiC molecule. This configuration enhances the crystal growth rate as the precipitation of source vapors outside of the seed crystal growth surface is minimized.

In the preferred embodiment, source 101 is comprised of SiC ceramics that are produced from SiC powder that has been sintered at a temperature that permits partial over-sublimation of the SiC grains. The sintering process is preferably carried out in an inert gas environment (e.g., argon) within a temperature range of 1500 to 2300° C. In addition to achieving partial binding of the powder, during the sintering process basic background impurities and dust are removed from the powder, thus preventing the dust composition from being transferred from the evaporating surface of source 101 in the vapor phase. The SiC ceramics used for source 101 can also be fabricated by compressing SiC powder.

Additionally, during the fabrication of the SiC ceramics, a doping agent can be deliberately introduced. By using SiC ceramics in which the dopant has been uniformly distributed throughout the entire volume, a uniformly doped single crystal can be grown.

In another embodiment of the invention, a SiC polycrystal or mono-crystal source is used.

As shown in FIG. 1, in the preferred embodiment SiC source 101 is located on the bottom of crucible 105 and seed crystal 103 is mounted to the top surface of the crucible. Alternately, source 101 can be mounted on the top surface of the crucible with seed crystal 103 mounted to the crucible's bottom surface. In order to prevent the loss of SiC source material due to precipitation of SiC vapors outside the growth surface, preferably the inner dimensions of crucible 105 in general, and crucible sidewalls 109 in particular, do not exceed the dimensions of growth zone 107. Accordingly, in this embodiment of the invention, sidewalls 109 define the periphery of growth zone 107. If the inner dimensions of sidewalls 109 do exceed the dimensions of growth zone 107, preferably it is by a minor amount.

As described in further detail below, crucible 105 is comprised of tantalum (Ta) or niobium (Nb) that has been specially treated. It has been established by the inventors that as a result of such treatment, the crucible exhibits a depth-variable composition of Ta—Si—C or Nb—Si—C that is no longer capable of absorbing SiC vapors as the monocrystalline silicon carbide is grown. Consequently, during crystal growth the vapor-phase composition within crucible 105 is close to the SiC—Si system with the partial pressure of Si-vapor slightly higher than that in the SiC—Si system. Additionally, the resultant variable composition Ta—Si—C or Nb—Si—C is a refractory material that can withstand the operating temperatures required to grow the SiC single crystal.

Figure 3:
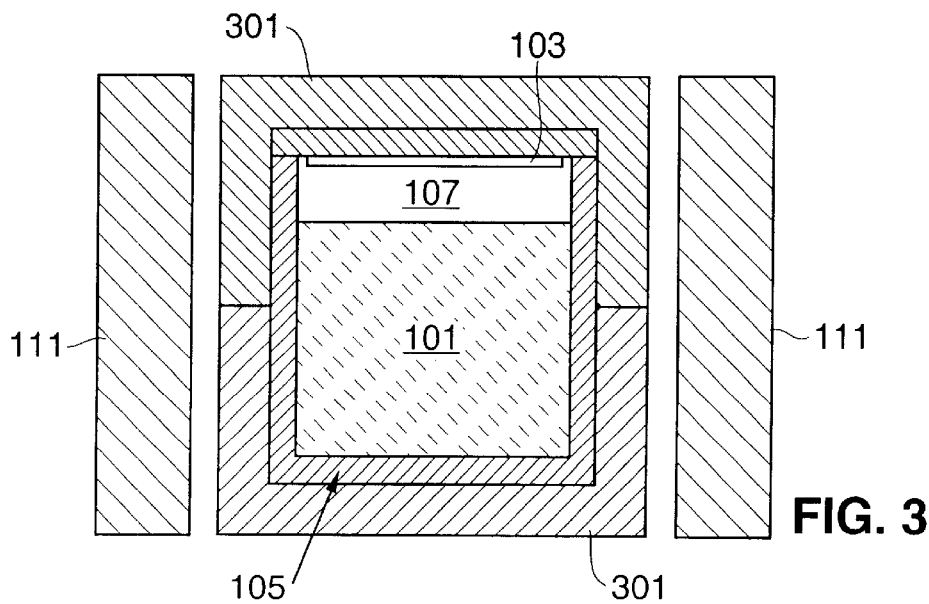
FIG. 3 is a cross-sectional view of a crucible similar to that shown in FIG. 1 with a separate, sealable container.

Preferably crucible 105 is capable of being evacuated and sealed, either directly or indirectly through the use of an external container 301 as illustrated in FIG. 3. In one embodiment of the invention, after crucible 105 is loaded with source 101 and seed 103, it is placed within a high temperature oven 111. Oven 111 provides an axial temperature gradient from seed 103 to source 101, resulting in the evaporation of the SiC of source 101 and vapor phase crystallization of SiC on the growing surface of seed 103. In this embodiment crucible 105 (or container 301) is sealed before the final operating temperature is reached, sealing being accomplished using any of a variety of sealing systems (e.g., vacuum welding, graphite or other based sealants, etc.). In an alternate embodiment, crucible 105 (or container 301) is evacuated and hermetically sealed prior to placement within high temperature furnace 111.

If the crystal growing process is run for an extended time period, for example as required to grow an exceptionally large crystal, the gradually increasing thickness of the grown crystal is accompanied by a corresponding decrease in the thickness of source 101. Accordingly, in order to maintain the growth process, a large source must be used, for example, a source rod of SiC that can be continuously fed into growth zone 107.

In the illustrated embodiment, furnace 111 provides the required thermal gradient, either through the use of multiple temperature zones (e.g., one zone for source 101 and one zone for seed crystal 103) or other means. During crystal growth, a stable temperature profile must be maintained throughout the entire growth period. Preferably this is achieved by altering the relative positions of crucible 105 and furnace 111, for example by moving crucible 105 within furnace 111 at a rate that is substantially equivalent to the growth rate.

As previously disclosed, preferably growth zone 107 is evacuated and sealed prior to initiation of the sublimation process. As a result, material losses from source 101 are substantially reduced. Additionally, sealing crucible 105, either directly or through the use of separate container 301, prevents foreign impurities from the environment from entering into growth zone 107.

By isolating the growth zone from the environment and using a crucible exhibiting a depth-variable composition of Ta—Si—C or Nb—Si—C, the vapor phase in the growth zone shifts from the SiC—C system to the SiC—Si system. Furthermore, as the depth-variable composition of Ta—Si—C or Nb—Si—C remains relatively unchanged for an extended period of time, a stable composition of the vapor phase within growth zone 107 can be achieved, thereby resulting in improvements in both crystal quality and size. For example, the present invention allows SiC single crystals to be grown with a dislocation density of less than $10^4$ per square centimeter, preferably less than $10^3$ per square centimeter, and more preferably less than $10^2$ per square centimeter. The density of micropipes in the as-grown material is less than 10 per square centimeter. The density of secondary phase inclusions is less than 10 per cubic centimeter and preferably less than 1 per cubic centimeter. Depending upon the construction of the crucible, the concentration of tantalum or niobium impurities is less than $10^{17}$ per cubic centimeter and typically in the range of $10^{16}$ to $10^{17}$ per cubic centimeter.

In order to grow a SiC crystal of the 4H polytype, a 4H polytype single crystal is used as seed 103 and the growth process is carried out in the presence of tin vapors that have been introduced into the crucible prior to its sealing.

Crucible Preparation

As previously disclosed, crucible 105 is preferably fabricated from tantalum or niobium, thereby allowing the vapor composition during growth to remain close to equilibrium thus reducing crystal graphitization. The tantalum or niobium must be pre-treated, however, to prevent the metals from interacting with the Si—C vapor and forming low-temperature eutectics. The pre-treatment consists of two stages. First, tantalum or niobium carbide layers are formed on the surface. During SiC crystal growth, binding of carbon vapor leads to deeper diffusion of carbon atoms into the pure metal. Second, tantalum or niobium silicide surface layers are formed, the existence of which increases silicon containing species partial pressure.

Initially crucible 105 is fabricated from metallic tantalum or niobium, the metal being at least 99.9 percent pure and of any suitable shape (e.g., rod, rolled, etc.). It is understood that the shape of crucible 105 is not limited to the shape shown in FIGS. 1–3. Once the crucible has been shaped, for example using standard machining processes, it is initially cleaned with standard organic solvents. The crucible is then boiled for 30 minutes in a pre-heated acid solution comprised of a 3:1 mixture of HCl and $HNO_3$, the acid solution removing metallic remnants left on the surface after crucible shaping. The crucible is then etched in a room temperature 1:1 mixture of $HNO_3$ and HF for approximately 20 to 30 seconds. This etching step must be short to insure that the etchant does not damage the surface finish quality of the crucible. After etching, the crucible is washed in distilled or deionized boiling water for 10 minutes, the water being changed three times during the process. Lastly, the crucible is dried.

After the crucible has been fabricated and the surfaces cleaned, preferably following the above-described process, the crucible is processed in carbon containing vapor in order to form a thin, near-surface layer of Ta—C or Nb—C. After further temperature processing, this layer protects the crucible's surfaces from interaction with carbon particles.

During carbon vapor processing, the crucible is placed within a furnace and annealed at a pressure of at least $10^{-3}$ Torr in graphite that is at least 99.99 percent pure. Alternately, the crucible is annealed at a pressure of at least $10^{-1}$ Torr in vapor that contains carbon species. Preferably a step-wise annealing process is used, such that the crucible is annealed at 800°±50° C. for one hour, followed by a 1500°±50° C. anneal for one hour, and ending with a 2000°±50° C. anneal for two hours. As a result of this annealing process, a thin near-surface layer comprised of Ta—C or Nb—C carbides is formed on the entire surface of the crucible. The depth of carbon penetration for crucibles in which the material is prepared by vacuum melting or metal rolling is approximately 5 to 30 microns while the penetration depth for crucibles formed of materials prepared by powder metallurgy is approximately 100 to 500 microns, the greater penetration depth due to accelerated diffusion along grain boundaries. Quality of the layer as well as the boundary between the metal and the carbide is governed by the technique used to fabricate the metal (e.g., powder metallurgy, rolled metal, vacuum melting, etc.).

After formation of the carbide layer, the crucible is subjected to further temperature processing, thus assuring that the layer protects the surface of the crucible from interaction with carbon particles. During this processing step the crucible is placed in graphite powder in an argon atmosphere, the graphite powder being at least 99.99 percent pure with a grain size of less than 100 microns and the argon being at least 99.999 percent pure. If the crucible is formed of tantalum it is annealed at a temperature of between 2200 and 2500° C. If the crucible is formed of niobium it is annealed at a temperature of between 2000 and 2300° C. The annealing time for either material is at least 2 hours, the final annealing time being governed by the thickness of the crucible.

Lastly the crucible is annealed for at least 2 hours in silicon containing vapor (i.e., SiC or Si vapor) that is diluted by purified argon. The annealing temperature for a crucible formed of tantalum is between 2200 and 2500° C. while the annealing temperature for a crucible formed of niobium is between 2000 and 2300° C. During annealing, the source of Si-vapor should not come into contact with the crucible.

Thus, for example, SiC powder is located in a higher temperature zone than the crucible with a temperature difference of between 10 and 20° C.

After completion of each of the annealing steps outlined above, the crucible is cooled to room temperature at a cooling rate less than 20° C. per minute. Additionally, during each annealing step the temperature variation across the surface of the crucible should be less than 20° C. After all stages of annealing are complete, the amount of carbon that has penetrated into the tantalum or niobium crucible surfaces should be more than 0.02 grams per square centimeter while the amount of silicon that has penetrated into the tantalum or niobium crucible surfaces should be more than 0.0005 grams per square centimeter.

EXAMPLES

SiC crystals have been grown using the disclosed processes, examples of which are provided below. A pre-treated tantalum crucible was used. During growth, the evaporating surface of source 101 was separated from the growing surface of seed 103 by approximately 3 to 18 millimeters. An operating temperature of between 1800–2500° C. was used with an axial temperature gradient of between 20 and 25 degrees per centimeter, yielding a growth rate of between 0.7 and 1.2 millimeters per hour.

Seed crystal polytypes included 6H SiC growing in direction [0001] Si; 4H SiC growing in direction [0001] C; and 6H SiC growing in a direction lying at an angle of 5 degrees to direction [0001].

The as-grown single crystals were approximately 10 millimeters thick with diameters ranging between 20 and 75 millimeters. The density of dislocations was in the range of $10^2$ and $10^4$ per square centimeter, the density being dependent upon the doping. The density of micropipes was less than 10 per square centimeter while the density of secondary-phase inclusions (i.e., carbon and silicon) was 10 per cubic centimeter. The measured concentration of background impurities was $10^{16}$ per cubic centimeter for nitrogen; $10^{16}$ per cubic centimeter for boron; and $10^{16}$ to $10^{17}$ per cubic centimeter for tantalum. There was no measurable graphitization of the source or the growing surface during a 10 hour growth procedure which was performed at a temperature of 2000° C. and at a pressure of $10^{-5}$ Torr. The seed polytype reproducibility was 80 percent for a 6H SiC seed growing in direction [0001] Si; 70 percent for a 4H SiC seed growing in direction [0001] C; and 100 percent for a 6H SiC seed growing in a direction lying at an angle of 5 degrees to direction [0001].

As will be understood by those familiar with the art, the present invention may be embodied in other specific forms without departing from the spirit or essential characteristics thereof. Accordingly, the disclosures and descriptions herein are intended to be illustrative, but not limiting, of the scope of the invention which is set forth in the following claims.

What is claimed is:

1. A method of pre-treating a crucible, the method comprising the steps of:
   fabricating the crucible from a tantalum material, the fabricated crucible comprising at least one interior crucible surface and at least one exterior crucible surface;
   forming a tantalum carbide layer on said at least one interior crucible surface; and
   forming a tantalum silicide layer on said tantalum carbide layer.

2. The method of claim 1, wherein said tantalum carbide layer is less than 30 microns thick.

3. The method of claim 1, wherein said tantalum carbide layer is less than 500 microns thick.

4. The method of claim 1, further comprising the step of selecting a purity level of said tantalum material to be at least 99.9 percent.

5. The method of claim 1, further comprising the step of cleaning said fabricated tantalum crucible in an organic solvent, said cleaning step performed prior to said tantalum carbide layer forming step.

6. The method of claim 1, further comprising the step of boiling said fabricated tantalum crucible in an acid solution comprised of a mixture of HCl and $HNO_3$ acids, said boiling step performed prior to said tantalum carbide layer forming step.

7. The method of claim 6, wherein said mixture of HCl and $HNO_3$ acids is in a ratio of 3 to 1.

8. The method of claim 6, further comprising the step of etching said fabricated tantalum crucible in a mixture of $HNO_3$ and HF acids, said etching step performed after said boiling step.

9. The method of claim 8, wherein said mixture of $HNO_3$ and HF acids is in a ratio of 1 to 1.

10. The method of claim 8, further comprising the step of washing said fabricated tantalum crucible in water, said washing step performed after said etching step.

11. The method of claim 1, said tantalum carbide layer forming step further comprising the step of annealing said fabricated tantalum crucible in at least 99.99 percent pure graphite.

12. The method of claim 11, wherein said annealing step is performed at a pressure of at least $10^{-3}$ Torr.

13. The method of claim 11, wherein said annealing step is comprised of a first annealing step at a first temperature of 800°±50° C., a second annealing step at a second temperature of 1500°±50° C., and a third annealing step at a third temperature of 2000°±50° C.

14. The method of claim 13, wherein said first annealing step is performed for approximately one hour, said second annealing step is performed for approximately one hour, and said third annealing step is performed for approximately 2 hours.

15. The method of claim 11, further comprising the step of cooling said fabricated tantalum crucible to room temperature at a cooling rate of less than 20° C. per minute, said cooling step performed after said annealing step.

16. The method of claim 1, said tantalum carbide layer forming step further comprising the step of annealing said fabricated tantalum crucible in a carbon containing vapor.

17. The method of claim 16, wherein said annealing step is performed at a pressure of at least $10^{-1}$ Torr.

18. The method of claim 16, wherein said annealing step is comprised of a first annealing step at a first temperature of 800°±50° C., a second annealing step at a second temperature of 1500°±50° C., and a third annealing step at a third temperature of 2000°±50° C.

19. The method of claim 18, wherein said first annealing step is performed for approximately one hour, said second annealing step is performed for approximately one hour, and said third annealing step is performed for approximately 2 hours.

20. The method of claim 16, further comprising the step of cooling said fabricated tantalum crucible to room temperature at a cooling rate of less than 20° C. per minute, said cooling step performed after said annealing step.

21. The method of claim 1, further comprising the step of annealing said tantalum carbide layer in a graphite powder in an inert gas atmosphere.

22. The method of claim 21, wherein said graphite powder is at least 99.99 percent pure.

23. The method of claim 21, wherein said graphite powder has a grain size of less than 100 microns.

24. The method of claim 21, wherein said inert gas is argon gas.

25. The method of claim 24, wherein said argon gas is at least 99.999 percent pure.

26. The method of claim 21, wherein said annealing step is performed at a temperature of between 2200° C. and 2500° C. for at least two hours.

27. The method of claim 21, further comprising the step of cooling said fabricated tantalum crucible to room temperature at a cooling rate of less than 20° C. per minute, said cooling step performed after said annealing step.

28. The method of claim 1, said tantalum silicide layer forming step further comprising the step of annealing said formed tantalum carbide layer for at least two hours in a silicon containing vapor.

29. The method of claim 28, wherein said silicon containing vapor is diluted by argon gas.

30. The method of claim 28, wherein said annealing step is performed at a temperature of between 2200° C. and 2500° C.

31. The method of claim 28, further comprising the step of cooling said fabricated tantalum crucible to room temperature at a cooling rate of less than 20° C. per minute, said cooling step performed after said annealing step.

32. A crucible fabricated from tantalum, comprising:
   a plurality of interior surfaces;
   a plurality of exterior surfaces;
   a tantalum carbide layer formed on said plurality of interior surfaces; and
   a tantalum silicide layer formed on said tantalum carbide layer.

33. The crucible of claim 32, wherein a carbon concentration in said tantalum carbide layer is greater than 0.02 grams per square centimeter.

34. The crucible of claim 32, wherein a silicon concentration in said tantalum silicide layer is greater than 0.0005 grams per square centimeter.

* * * * *